United States Patent [19]

Faust

[11] 4,088,498

[45] May 9, 1978

[54] PHOTOPOLYMERIZABLE COPYING COMPOSITION

[75] Inventor: Raimund Josef Faust, Wiesbaden-Biebrich, Germany

[73] Assignee: Hoechst Aktiengesellschaft, Germany

[21] Appl. No.: 688,450

[22] Filed: May 20, 1976

Related U.S. Application Data

[63] Continuation of Ser. No. 366,570, Jun. 4, 1973, abandoned, which is a continuation-in-part of Ser. No. 212,372, Dec. 27, 1971, abandoned.

[30] Foreign Application Priority Data

Dec. 28, 1970 Germany .............................. 2064079

[51] Int. Cl.$^2$ .......................... G03C 1/68; G03C 1/94; C08F 8/00
[52] U.S. Cl. ................................... 96/115 P; 96/86 P; 96/87 R; 204/159.15; 204/159.16
[58] Field of Search ................. 96/115 P, 86 P, 87 R; 204/159.16, 159.15, 159.12, 159.23

[56] References Cited

U.S. PATENT DOCUMENTS

| | | | |
|---|---|---|---|
| 3,625,696 | 12/1971 | Krauch et al. ...................... | 96/115 P |
| 3,740,224 | 6/1973 | Barzynski et al. ................. | 96/115 P |
| 3,759,807 | 9/1973 | Osborn et al. .................... | 204/159.23 |
| 3,850,770 | 11/1974 | Juna et al. .......................... | 96/115 P |

*Primary Examiner*—Jack P. Brammer
*Attorney, Agent, or Firm*—James E. Bryan

[57] ABSTRACT

This invention relates to a photopolymerizable copying composition comprising at least one binder, at least one photoinitiator, and at least one polymerizable compound having the formula

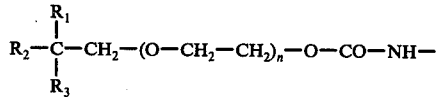

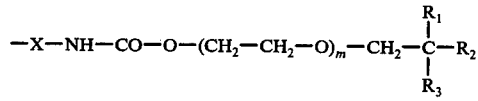

wherein
X is a saturated hydrocarbon group having 2 to 12 carbon atoms or an arylene group having 6 to 10 carbon atoms,
$R_1$ is an alkyl group having 1 to 3 carbon atoms, $R_4$ or $-CH_2R_4$
$R_2$ and $R_3$ are H, $CH_3$, or $-CH_2R_4$,
$R_4$ is $-O-CO-CR_5=CH_2$
$R_5$ is H or $CH_3$, and
n and m are integers from 0 to 4,
$R_4$ being present in at least one of the groups $R_1$, $R_2$, and $R_3$.

7 Claims, No Drawings

PHOTOPOLYMERIZABLE COPYING COMPOSITION

This is a continuation of application Ser. No. 366,570, filed June 4, 1973 now abandoned, in turn, a continuation-in-part of Ser. No. 212,372, filed Dec. 27, 1971 now abandoned.

This invention relates to a new photopolymerizable copying composition which may be in the liquid form or a solid layer on a support and which contains, as essential constituents, at least one binder, at least one polymerizable compound and at least one photoinitiator.

Photopolymerizable compositions as used at present as copying layers in the reproduction field contain photopolymerizable compounds, e.g., esters of acrylic or methacrylic acid, particularly those of acrylic acid, with polyhydric aliphatic alcohols. Exemplary thereof are the following monomers: hexanediol(1,6)-diacrylate, triethylene glycol diacrylate, polyethylene glycol diacrylate, neopentyl glycol diacrylate, diglycerol diacrylate, trimethylol propane triacrylate, pentaerythritol tetraacrylate, and dipentaerythritol hexaacrylate.

The monomers employed heretofore, such as triethylene glycol diacrylate, trimethylol ethane triacrylate, and trimethylol propane triacrylate, have an undesirably high volatility, or those such as pentaerythritol tetraacrylate are solid at room temperature and crystallize in the photopolymer layer. A number of deficiencies result therefrom. Other monomers have sufficiently low vapor pressures and a viscous fluid character, e.g., polyethylene glycol diacrylate and pentaerythritol triacrylate, but these monomers generally can be used only on specially modified metal supports, e.g., on specially roughened and optionally anodized aluminum, since adhesion to other metallic supports is insufficient.

This disadvantage is significant particularly in the case of supports of copper and when the layer is to be developed with aqueous alkaline solutions, i.e., when binders soluble or swellable in aqueous alkali are used. Practically all acrylic and methacrylic esters hitherto suggested for photopolymer layers do not possess sufficient adhesion to copper in combination with binders developable with aqueous alkaline media. Those binders include, for example, the otherwise often used copolymers of methyl methacrylate and methacrylic acid with acid numbers above 150.

The present invention provides new photopolymerizable monomers with which it is possible to formulate layers developable with aqueous alkaline media and which, after exposure, have a good adhesion to metallic supports, e.g., to copper.

The present invention provides a new photopolymerizable copying composition containing, as essential constitutents, at least one binder, at least one polymerizable compound and at least one photoinitiator. The copying composition contains, as the polymerizable compound, at least one compound of the general formula I

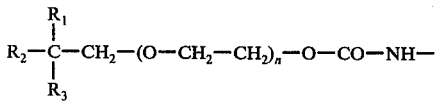

-continued

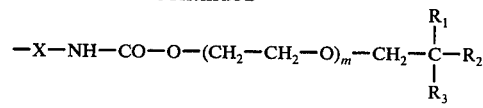

wherein
X is a saturated hydrocarbon group with 2 to 12 carbon atoms or an arylene group with 6 to 10 carbon atoms,
$R_1$ is alkyl with 1 to 3 carbon atoms, $R_4$ or $CH_2R_4$
$R_2$ and $R_3$ are identical or different and are H, $CH_3$ or $CH_2R_4$,
$R_4$ is $O-CO-CR_5=CH_2$,
$R_5$ is H or $CH_3$, and
n and m are identical or different numbers from 0 to 4, preferably from 0 to 2,
$R_4$ being present in at least one of the groups $R_1$, $R_2$, and $R_3$.

Preferably, those compounds are employed in which X is a saturated hydrocarbon group which may be straight-chain, branched, or alicyclic, or composed of such constituents. Longer aliphatic or cycloaliphatic groups are particularly preferred, i.e., those with about 4 to 12 carbon atoms, since those compounds are easily made and yield layers with particularly good mechanical properties.

After exposure to light, the copying compositions of the invention yield hardened layer parts which have an excellent adhesion to all kinds of metal supports, particularly to copper, whereas the unexposed layer parts can be removed easily and cleanly with aqueous alkaline developer solutions. A particularly good adhesion is displayed by copying compositions of monomers in which the group R contains at least one, preferably more, lateral methyl groups. The methacrylates also display advantages over the acrylates, particularly regarding adhesion to copper supports.

The monomers used in accordance with the invention are highly viscous, substantially colorless products. They are prepared in known manner from diisocyanates and acrylic or methacrylic partial esters of polyhydric alcohols. The partial esters used, which contain at least one, but preferably not more than one, free hydroxy group are for the most part known and suitable themselves as photomonomers.

Exemplary of such partial esters are hydroxyethyl acrylate, hydroxypropyl acrylate (n or iso), hydroxyethyl methacrylate, 2-hydroxybutylmethacrylate, 4-hydroxy-butylmethacrylate, trimethylol ethane diacrylate, trimethylol propane dimethacrylate, pentaerythritol triacrylate, and pentaerythritol trimethacrylate, diethylene glycol monoacrylate, triethylene glycol monomethacrylate, and other polyalkylene glycol monomethacrylates with up to about 5 oxyethylene units. Also suitable are the known reaction products of alkylene oxides, particularly ethylene oxide, with for example trimethylol propane trimethacrylate, pentaerythritol triacrylate and trimethylol ethane dimethacrylate with 1 to 4 oxyalkylene units. From these partial esters the compounds free from ether linkages, i.e., those wherein n or m, respectively, is zero, are particularly preferred in the present compositions.

The diisocyanates used as reactants are also known or can be prepared analogously to known compounds. Exemplary are ethylene diisocyanate, propylene diisocyanate, butylene-1,3-diisocyanate, hexamethylene diisocyanate, 2,2,4-trimethyl-hexamethylene diisocyanate, 2,4-dimethyl-6-ethyloctamethylene diisocyanate, cyclohexylene diisocyanate, cyclopentylene diisocyanate, 1,4-diisocyanatomethyl-cyclohexane, 1,3-diisocyanatoethylcyclohexane, toluylene diisocyanate, naphthylene diisocyanate, and cumene-2,4-diisocyanate.

The reaction advantageously is performed in the presence of a tertiary amine as a catalyst in an inert solvent, such as benzene or toluene. Generally, for the purpose of simpler production, the symmetrical diurethanes which are obtained from 1 mole of diisocyanate and 2 moles of a hydroxy compound are preferred. It is equally advantageous to use the mixed representatives in which the radicals at both urethane groups are different. For the production of light-sensitive copying compositions, it even may be of advantage if the monomer is a reproducible but nonuniform mixture of various constituents since, according to experience, particularly homogeneous non-crystallizing copying layers can be produced therewith.

Some of the diurethanes used in accordance with the invention are known from U.S. Pat. No. 3,297,745. Utilization thereof for the production of photopolymerizable compositions is not mentioned.

In addition to photoinitiators, binders and the described polymerizable compounds, the copying composition of the invention may contain other additives, e.g.:
  inhibitors, to prevent thermal polymerization of the compositions,
  hydrogen donors,
  substances modifying the sensitometric properties of such layers,
  dyes,
  colored and uncolored pigments,
  color precursors,
  indicators, and
  plasticizers.

Advantageously, these constitutents should be so selected that they absorb as little as possible within the actinic range which is important for the initiating process.

A variety of substances may be used as photoinitiators in the copying composition of the invention, for example: benzoin; benzoin ethers; multinuclear quinones, such as 2-ethyl-anthraquinone; acridine derivatives, such as 9-phenyl-acridine, 9-p-methoxyphenyl-acridine, 9-acrylamino-acridine or benz(a)-acridine; phenazine derivatives, such as 9,10-dimethyl-benz(a)-phenazine, 9-methylbenz(a)-phenazine or 10-methoxy-benz(a)-phenazine; quinoxaline derivatives, such as 6,4′,4″-trimethoxy-2,3-diphenylquinoxaline or 4′,4″-dimethoxy-2,3-diphenyl-5-aza-quinoxaline; and quinazoline derivatives.

Numerous soluble organic polymers may be employed as binders. The following are exemplary: polyamides, polyvinyl esters, polyvinyl acetals, polyvinyl ethers, polyacrylic esters, polymethacrylic esters, polyesters, alkyd resins, polyacrylamide, polyvinyl alcohol, polyethylene oxide, polydimethyl acrylamide, polyvinyl pyrrolidone, polyvinyl methyl formamide, polyvinyl methyl acetamide, and copolymers of the monomers forming these homopolymers.

Further, natural substances or modified natural substances, such as gelatin, cellulose ethers, and the like, may be used as binders.

Advantageously, those binders are used which are soluble or at least swellable in aqueous alkaline solutions, because layers containing such binders may be developed by means of the preferred aqueous alkaline developers. Binders of this type may contain the following groups, for example: —COOH, —PO$_3$H$_2$, —SO$_3$H$_2$, —SO$_3$H, —SO$_2$NH$_2$, and —SO$_2$—NH—CO—. Examples of such binders, which are preferably used, are: maleic resins, polymers of N-(p-tolylsulfonyl)-carbamic acid-($\beta$-methacryloyloxy)-ethyl ester, and copolymers of these and similar monomers with other monomers, copolymers of styrene and maleic anhydride, and copolymers of methyl methacrylate and methacrylic acid.

In order to achieve the advantages of the present invention, the photopolymerizable compositions should contain at least 20 and not more than 80 parts by weight of polymer binders per 100 parts by weight of the sum of monomers and binders. Preferably the proportion of polymers in this mixture is between 40 and 70 parts by weight.

Small quantities of other photopolymerizable monomers also may be added to the copying compositions of the invention, take care, of course, that the above described advantages achieved by the use of the inventive monomers in the photopolymerizable composition are not unduly reduced by such addition. Generally, the proportion of such monomers should not exceed about 20 percent, based on the total monomer weight.

The copying composition of the invention may be used commercially in the form of a solution or dispersion, e.g., as a so-called photoresist composition which is applied by the user himself to an individual support, e.g., for chemical milling or for the production of printed circuits, and is then dried, exposed and developed. For the same purposes, the composition also may be employed as a readily transferrable light-sensitive layer on an intermediate support, e.g., a plastic film. In this case, the layer may be laminated by the user, with pressure and heating, to the desired support, then exposed, and, after stripping of the intermediate support, developed. The composition also may be marketed as a completely presensitized light-sensitive copying material, e.g., for the production of printing plates for planographic, relief or intaglio printing.

Although the copying compositions of the invention are relatively insensitive to the oxygen contained in the air, it is frequently advantageous to protect the compositions effectively from access to oxygen during photopolymerization. When the composition is used in the form of a presensitized copying material, it is advantageous to apply a suitable cover film of low oxygen permeability. The film may be self-supporting and may be peeled off prior to development of the copying layer or, preferably, may consist of a material which dissolves in the developer liquid or at least can be removed in the nonhardened areas during developing. Suitable materials for this purpose include waxes, polyvinyl alcohol, polyphosphates, and sugar. When the composition is present in the form of a transferrable photoresist layer on an intermediate support, it advantageously may be covered on the other layer side with a thin strippable protective film, e.g., of polyethylene.

Suitable supports for copying materials prepared from the copying composition of the invention are: metal foils, such as aluminum, steel, zinc, and copper foils; plastic films, such as polyethylene terephthalate or cellulose acetate films; and screen printing supports, such as "Perlon" gauze. The support may be pretreated chemically or mechanically in order to properly adjust the adhesion of the layer or to reduce the reflection of the support within the actinic range of the copying layer (anti-halation).

The light-sensitive materials in which the copying composition of the invention is employed are produced in known manner. The copying composition may be dissolved or dispersed in a solvent and the resulting solution or dispersion may be applied as a film to the selected support, for example by casting, spraying, immersion or roller application, and then dried. Thick layers (e.g., of 250μ or more) may be produced in the form of self-supporting films, by extrusion or calendering, and then laminated to the support.

The copying layers are exposed and developed in known manner. Suitable developers preferably are aqueous alkaline solutions, e.g., of alkali phosphates or alkali silicates, to which, optionally, small quantities of miscible organic solvents may be added. If desired, it is also possible to use organic solvents or mixtures thereof as developers.

As mentioned above, the copying compositions of the invention may be used in various application fields. They are particularly advantageously employed for the production of photoresist or etch resist layers on metallic supports. They are particularly suitable for the application to supports of copper, as they are used for example for the production of printed circuits, of intaglio printing forms and of multimetal offset printing forms. The excellent adhesion of the exposed layer parts has proved suitable in these preferred application fields not only during development but also during subsequent etching of the support, in which the layers have a good etching resistance when suitable binders are used.

The copying compositions may be employed and handled particularly advantageously in the form of so-called dry resist materials as they are described above since they also can be transferred in the dry state to metal supports to give firmly adhering layers. In this case, polyester films are particularly suitable as transparent intermediate supports.

The following examples illustrate some specific embodiments of the copying composition of the invention. Unless otherwise stated, percentages and quantitative ratios are by weight. The relation between parts by weight and parts by volume corresponds to that between grams and milliliters.

EXAMPLE 1

A solution of

| | | |
|---|---|---|
| 2.8 | parts by weight | of a terpolymer of methyl methacrylate, n-hexylmethacrylate, and methacrylic acid (25:125:30), having an acid number of 202, |
| 2.8 | parts by weight | of the reaction product described below of 2,2,4-trimethylhexamethylene diisocyanate and hydroxyethyl methacrylate, |
| 0.12 | part by weight | of 1,2-benzacridine, |
| 0.1 | part by weight | of mercaptobenzthiazole, |
| 0.25 | part by weight | of triethylene glycol diacetate, and |
| 0.04 | part by weight | of tri-[4-(3-methyl-phenylamino)-phenyl]-methacetate | in 20 parts by volume of ethylene glycol monoethyl ether is purified by filtration from possibly occurring undissolved portions. The coating solution is then whirl-coated onto the support indicated below. The plates obtained are dried for 2 minutes at 100° C in a drying cabinet; the weight of the layer ranges from 4 to 10 g/m².

The photomonomer used is prepared as follows:

6,750 parts by volume of dry benzene, 1,170 parts by weight of hydroxyethyl methacrylate, 945 parts by weight of 2,2,4-trimethylhexamethylene diisocyanate, and 4.5 parts by weight of diethyl cyclohexylamine with the addition of 45 parts by weight of copper powder are heated for 4 hours, to slight boiling, in a three-necked flask equipped with stirrer, reflux condenser, and drying tube. After cooling, the copper is filtered off and the benzene solution is shaken twice with 1,000 parts by volume of saturated NaCl solution and once with water. 10.5 parts by weight of hydroquinone monomethyl ether are then added to the benzene solution and the benzene is removed in individual portions in a revolving vacuum evaporator at 50° C.

Yield: 1,910 parts by weight = 90.5 percent of theoretical.

The product contains 0.55 percent by weight of stabilizer.

Analysis: N, calculated: 5.95; found: 5.9.

In a xenon copying device manufactured by Klimsch & Co., Frankfurt/Main, Germany (Type Bikop, Model Z), and having an output of 8 kW, the layer is exposed for 1 minute at a distance of 80 cm between the lamp and the copying frame under a combined negative original consisting of a 21-step continuous tone grey wedge which has a density range of 0.05 to 3.05 with density increments of 0.15 and line and dot screen originals having 60 and 120 screen elements per cm.

The exposed copying layer is developed with an aqueous alkaline developer of a pH value of 11.3 and having the following composition:

1,000 parts by weight of water, 1.5 parts by weight of sodium metasilicate nonahydrate, 3 parts by weight of Polyglycol 6000, 0.6 part by weight of levulinic acid, and 0.3 part by weight of strontium hydroxide octahydrate. The plate is wiped over with the developer for 30 to 60 seconds and then rinsed with water. Fixation is performed with 1 percent phosphoric acid and the plate is then inked up with black greasy ink.

The following are used as support materials:
(a) aluminum mechanically roughened by means of wire brushes,
(b) electrolytically roughened and anodized aluminum with 3 g of oxide/m²,
(c) sheet chromium,
(d) sheet steel, and
(e) sheet steel, tin-plated.

Good adhesion of the photopolymer layer to all the support materials is achieved. Development of the non-image areas can be performed cleanly so that even the fine dots of the screen having 120 screen elements per cm are faithfully reproduced.

The relative light-sensitivity of the plates exposed as described above is 5 to 6 wedge steps in the case of supports (a), (c), (d), and (e) and 7 to 8 wedge steps in the case of the more modified support (b).

The printing plates thus obtained can be used directly for offset printing.

As shown by the example, it is not necessary to apply an oxygen barrier layer to the copying layer. When nevertheless applying a top layer of sugar, methyl cellulose and saponin (2:1:0.15) from a solution in 96.85 parts by weight of water, two to three wedge steps more are obtained, on an average.

Due to the high viscosity of the monomer used, the copying layers with and without a top layer have non-tacky surfaces of good feel. The developer resistance of these layers is very good.

The planographic printing plates yield more than 100,000 prints in an offset printing machine, type Dualith 500 manufactured by Messrs. Davidson, U.S.A. The storability of the copying layer is excellent.

EXAMPLE 2

A solution of

| 2.8 | parts by weight | of a copolymer of methyl methacrylate and methacrylic acid, having an acid number of 85 and an average molecular weight of 34,000, |
| --- | --- | --- |
| 2.8 | parts by weight | of the monomer below, |
| 0.2 | part by weight | of 9-phenyl-acridine, |
| 0.03 | part by weight | of the triphenyl methane dye used in Example 1, and |
| 0.25 | part by weight | of triethylene glycol diacetate | in 30 parts by volume of ethylene glycol monoethyl ether is filtered and whirlcoated onto electrolytically roughened and anodized aluminum with 3 g of oxide/m$^2$ in layer thicknesses of 4 to 6 g/m$^2$ (dry). Exposure, development and assessment of the printing plate are the same as in Example 1. At an exposure time of 1 minute with the copying device indicated there, 7 to 8 fully blackened wedge steps are obtained.

The monomer used is the reaction product of 1 mole of 1,1,3-trimethyl-3-isocyanatomethyl-5-isocyanato-cyclohexane and 2 moles of hydroxyethyl methacrylate. It is prepared analogously to the process of Example 1 (N, calculated: 5.8%; found: 5.7%).

Instead of the mentioned photomonomer, it is also possible to use equal quantities of the reaction product of 1 mole of 2,2,4-trimethylhexamethylene diisocyanate and 2 moles of hydroxypropyl methacrylate (N, calculated: 5.62%; found: 5.3%) or of the reaction product of 1 mole of 2,2,4-trimethyl-hexamethylene diisocyanate and 2 moles of hydroxyethyl acrylate (N, calculated: 6.34%; found: 6.2%). When exposure and development are the same as above, 6 or 5 fully blackened wedge steps are obtained.

Useful printing forms are also obtained with the use of a monomer obtained by the reaction of 1 mole of ethylene diisocyanate with 2 moles of hydroxypropyl methacrylate.

EXAMPLE 3

A solution of

| 2.8 | parts by weight | of the terpolymer used in Example 1, |
| --- | --- | --- |
| 2.8 | parts by weight | of the monomer below, |
| 0.2 | part by weight | of 9-phenyl-acridine, |
| 0.25 | part by weight | of diethylene glycol monohexyl ether, and |
| 0.03 | part by weight | of the triphenyl methane dye used in Example 1 | in 30 parts by volume of ethylene glycol monoethyl ether is filtered and whirlcoated onto electrolytically roughened and anodized aluminum with 3 g of oxide/m$^2$. Exposure, development and assessment are the same as in Example 1; 7 fully blackened and a total of 9 discernible wedge steps are obtained.

The monomer used is prepared by the reaction of 1 mole of 2,2,4-trimethyl-hexamethylene diisocyanate with 2 moles of pentaerythritol triacrylate in the manner described in Example 1 (N, calculated: 3.48%; found: 3.2%).

Instead of the above-described product, it is also possible to use the same quantity of the reaction product of 1 mole of 2,2,4-trimethyl-hexamethylene diisocyanate and 2 mols of trimethylol ethane diacrylate (N, calculated: 4.21%; found: 4.2%) or of the reaction product of 1 mole of 1,1,3-trimethyl-3-isocyanatomethyl-5-isocyanato-cyclohexane and 2 moles of hydroxyethyl acrylate (N, calculated: 6.17%; found: 6.3%). 10 or 4 fully blackened wedge steps are obtained when exposure and development are the same as above.

EXAMPLE 4

A printing plate suitable for letterpress printing is prepared from the following constituents:

| 10.0 | parts by weight | of the terpolymer used in Example 1, |
| --- | --- | --- |
| 6.0 | parts by weight | of the monomer used in Example 1, |
| 1.0 | part by weight | of triethylene glycol diacetate, and |
| 0.06 | part by weight | of benzoin isopropyl ether. |

The components are dissolved in 25 ml of ethylene glycol monoethyl ether and the solution is cast onto a horizontal electrolytically roughened and anodized aluminum support and dried. The dry, about 1 mm thick layer is exposed for 10 minutes at a distance of 5 cm under a combined original, containing line screened parts and text parts, by means of a tubular exposure device manufactured by Moll, Solingen-Wald, Germany, and having fluorescent tubes, arranged closely side by side, of the type Philips TLAK-40 W/05. Development is performed with an aqueous alkaline developer as described in Example 1. After slightly rubbing the exposed plate for about 15 to 20 minutes by means of a brush in the developer bath, a relief with sharp outlines and a relief depth of 0.5 mm is obtained.

Instead of the photomonomer, it is also possible to use equal quantities of the reaction product mentioned in Example 3 of 1,1,3-trimethyl-3-isocyanato-methyl-5-isocyanato-cyclohexane and hydroxyethyl acrylate, or of the reaction product of 1 mole of 2,2,4-trimethylhexamethylene diisocyanate, and 2 moles of pentaerythritol trimethacrylate, or of the reaction product of 1 mole of 1,1,3-trimethyl-3-isocyanatomethyl-5-isocyanato-cyclohexane and 2 moles of hydroxypropyl methacrylate.

The plates are exposed and developed as described above and reliefs of about 0.5 mm depth with good relief sharpness and good resolution up to 56 lines/cm are obtained.

EXAMPLE 5

A relief printing plate is produced by coating a zinc plate suitable for powderless etching with an etch resist layer. The etch resist layer has the following composition:

| 2.8 | parts by weight | of the terpolymer used in Example 1, |
| --- | --- | --- |
| 2.8 | parts by weight | of the monomer used in Example 1, |
| 0.1 | part by weight | of 9-phenyl-acridine, |
| 0.1 | part by weight | of polyoxyethylene sorbitan monooleate, |
| 0.04 | part by weight | of the dye used in Example 1, and |
| 13.0 | parts by weight | of ethylene glycol monoethyl ether. |

The solution is filtered and whirl-coated onto the zinc plate.

Exposure is performed for 1.5 minutes by means of the 5 kW xenon point light lamp COP 5000 manufactured by Staub, Neu-Isenburg, Germany, under a line screen original together with a Kodak step wedge. After development for 1 minute with the developer described in Example 1, a good image of the original is obtained; wedge steps obtained: 6.

For the production of a relief printing form, the bared zinc surface is etched for 5 minutes at room temperature with 6 percent nitric acid. Parallel tests with a machine for powderless etching with 6 percent nitric acid at 27° C also yield, after 30 minutes, printing forms which are suitable for letterpress printing.

EXAMPLE 6

A coating solution of

| 2.8 | parts by weight | of a copolymer of methyl methacrylate and methacrylic acid, having an acid number of 85 and an average molecular weight of 34,000, |
|---|---|---|
| 2.8 | parts by weight | of the monomer used in Example 1, |
| 0.2 | part by weight | of 9-phenyl-acridine, |
| 0.03 | part by weight | of the dye used in Example 1, |
| 0.25 | part by weight | of ethylene glycol monohexyl ether, and |
| 30.0 | parts by weight | of ethylene glycol monoethyl ether | is whirl-coated onto a bimetal plate of brass and chromium and dried. The copying layer is then coated with a 1 to 2μ thick protective layer of polyvinyl alcohol and exposure is performed for 30 seconds under a positive original to the light source indicated in Example 5 and development is the same as in Example 1. The bared chromium is then etched away for about 2 minutes with a solution of 17.4 percent of $CaCl_2$, 35.3 percent of $ZnCl_2$, 2.1 percent of HCl, and 45.2 percent of water, and the hardened photopolymer layer is removed with ethylene glycol monoethyl ether/actone. The plate is then wiped over with 1 percent phosphoric acid and inked up with greasy ink. The bimetal plate is thus ready for printing.

EXAMPLE 7

A photoresist solution suitable for the production of printed circuits, halftone gravure forms and for chemical milling is prepared from the following components:

| 2.8 | parts by weight | of a terpolymer of methyl methacrylate, ethyl methacrylate, and methacrylic acid (75:375:90), havan acid number of 146, |
|---|---|---|
| 2.8 | parts by weight | of the monomer used in Example 1, |
| 0.2 | part by weight | of 9-phenyl-acridine, |
| 0.25 | part by weight | of triethylene glycol diacetate, |
| 0.03 | part by weight | of the dye used in Example 1, and |
| 30.0 | parts by volume | of ethylene glycol monoethyl ether. |

The solution is applied by immersion or whirl-coating in layer thicknesses of 3 to 10μ, preferably 5μ, (dry) to a plate of phenoplast material, to which a 35μ thick copper foil has been laminated, and dried for 2 minutes at 100° C. Exposure and development are the same as in Example 1. An excellently adhering etch resist with a very good resolution is obtained. The developer resistance is so good that, at 10 times the development time, still no attack of the developer onto the etch resist can be observed. The copper surfaces bared after development are etched at 42° C with a $FeCl_3$ solution of 42° Be. The etching time in a spray etching machine manufactured by Chemcut, Solingen, Germany, type 412 G, is about 45 seconds. The etching resistance of the resist layer is excellent. Under the conditions described, 10 full wedge steps are obtained.

In addition to the mentioned favorable properties, the described etch resist layer also has a good resistance to strongly acid (pH below 1) electroplating baths, e.g., in the tin electroplating bath, type Glanzzinnbad CULMO, in the Sn/Pb electroplating bath, type LA, and in the copper electroplating bath, type Feinkornkupferplasticbad MS, all of Dr. Ing. Max Schlötter, Geislingen-Steige, Germany, and in the Au electroplating bath, type Autronex N NB 181250 of Blasberg GmbH & Co., Solingen, Germany. This photoresist solution also has an excellent storability which can be further improved by the addition of radical inhibitors.

The liquid photoresist composition described above also may be used as a dry resist, when it is processed as described in Example 8. As a dry resist, the described mixture has similarly good properties.

EXAMPLE 8

A solution of

| 8.4 | parts by weight | of the terpolymer used in Example 1, |
|---|---|---|
| 8.4 | parts by weight | of the monomer used in Example 1, |
| 0.3 | parts by weight | of 1,2-benzacridine, |
| 0.75 | part by weight | of triethylene glycol diacetate, |
| 0.3 | part by weight | of the wetting agent used in Example 5, and |
| 0.12 | part by weight | of the dye used in Example 1, |
| 60.0 | parts by volume | of ethylene glycol monoethyl ether | is whirl-coated onto biaxially stretched 25μ thick polyethylene terephthalate film so that, after drying for 2 minutes at 100° C, a layer thickness of 10μ is obtained. A dry resist film of excellent flexibility and with a non-tacky surface at room temperature is obtained. The dry resist is laminated by means of a laminator, type 9 LD manufactured by General Binding Corporation, U.S.A., at 130° C to a phenoplast plate to which a 35μ thick copper foil has been laminated, exposed for 1 minute to the light source indicated in Example 5 and, after stripping of the polyester film, developed as in Example 1. The etch resist has similarly good properties regarding developer resistance and resistance to electroplating baths, as described in Example 7.

Wedge steps obtained: 8.

Also, in this case, an excellent storability of the light-sensitive dry resist material can be observed.

EXAMPLE 9

A solution of

| 2.8 | parts by weight | of the terpolymer used in Example 1, |
|---|---|---|
| 2.8 | parts by weight | of the monomer used in Example 1, |
| 0.5 | part by weight | of diethylene glycol monohexyl ether, |
| 0.03 | part by weight | of the dye used in Example 1, and |
| 0.025 | part by weight | of 9-phenyl-acridine, |
| 12.0 | parts by volume | of ethylene glycol monoethyl ether | is whirl-coated onto a 25μ thick polyethylene terephthalate film in such a manner that, after drying (8 minutes fan, 3 minutes at 100° C in a drying cabinet), a layer thickness of 25μ is obtained. As described in Example 8, the dry resist film is laminated to a plate laminated with copper. After development for 2 minutes, a cleanly developed image of the original is obtained. The developer resistance and the etching resistance as well as all properties described in Examples 7 and 8 are excellent.

Wedge steps obtained: 8.

This mixture also may be processed to give higher layer thicknesses (35, 60, and 120μ) and used as a dry resist.

When using, instead of the monomer, the equal quantity of the reaction product of 1 mole of 2,2,4-trimethylhexamethylene diisocyanate and 2 moles of triethylene glycol monoacrylate, a dry resist is obtained which has similarly good properties.

Wedge steps obtained: 9.

Similarly good properties are achieved with copying compositions according to Example 6, 7, or 8 when using, instead of the monomer used there, equal quantities of the reaction products of hexamethylene diisocyanate and hydroxypropyl methacrylate (N, calculated: 6.14%, found: 6.2%) or of 2,2,4-trimethyl-hexamethylene diisocyanate and hydroxypropyl acrylate (N, calculated: 5.88%, found: 5.8%), or of 1,1,3-trimethyl-3-isocyanatomethyl-5-isocyanato-cyclohexane and pentaerythritol trimethylacrylate (N, calculated: 3.1%, found: 3.2%) or of hexamethylene diisocyanate and trimethylol propane diacrylate (N, calculated: 4.28%, found: 4.3%).

It is somewhat more difficult to develop copying layers containing, instead of the mentioned monomers, the reaction product of toluylene diisocyanate and trimethylol propane diacrylate (N, calculated: 4.26%, found: 4.3%).

It will be obvious to those skilled in the art that many modifications may be made within the scope of the present invention without departing from the spirit thereof, and the invention includes all such modifications.

What is claimed is:

1. A photopolymerizable composition comprising at least one photoinitiator, at least one binder and from 20 to 80 parts by weight, per 100 parts by weight of the sum of binders and monomers, of at least one polymerizable compound having the formula

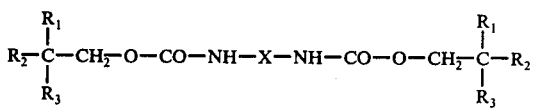

wherein
X is a saturated hydrocarbon group having 4 to 12 carbon atoms, and containing at least one lateral methyl group,
$R_1$ is an alkyl group having 1 to 3 carbon atoms, $R_4$ or $-CH_2R_4$,
$R_2$ and $R_3$ are H, $CH_3$, or $-CH_2R_4$,
$R_4$ is $-O-CO-CR_5=CH_2$, and
$R_5$ is H or $CH_3$,
$R_4$ being present in at least one of the groups $R_1$, $R_2$ and $R_3$,
said composition also containing at least 20 and not more than 80 parts by weight of binders per 100 parts by weight of the sum of monomers and binders.

2. A copying composition according to claim 1 in which $R_5$ is a methyl group.

3. A copying composition according to claim 1 comprising from 40 to 70 parts by weight of binders per 100 parts by weight of the sum of binders and monomers.

4. A copying composition according to claim 1 including a binder soluble or swellable in aqueous alkali.

5. A copying composition according to claim 1 containing the reaction product of 1 mole of 2,2,4-trimethyl-hexamethylene diisocyanate and 2 moles of hydroxyethyl methacrylate.

6. A copying composition according to claim 1 containing the reaction product of 1 mole of 2,2,4-trimethyl-hexamethylene diisocyanate and 2 moles of pentaerythritol triacrylate.

7. A copying composition according to claim 1 containing the reaction product of 1 mole of 2,2,4-trimethyl-hexamethylene diisocyanate and 2 moles of trimethylolethane diacrylate.

* * * * *